United States Patent [19]

Iida et al.

[11] Patent Number: 4,728,811
[45] Date of Patent: Mar. 1, 1988

[54] SAMPLE-AND-HOLD CIRCUIT

[75] Inventors: Tetsuya Iida; Takayoshi Ikarashi, both of Yokohama, Japan

[73] Assignee: Kabushiki Kaisha Toshiba, Kawasaki, Japan

[21] Appl. No.: 912,500

[22] Filed: Sep. 29, 1986

[30] Foreign Application Priority Data

Sep. 30, 1985 [JP] Japan ................................. 60-216689

[51] Int. Cl.4 ............................................. H03H 11/12
[52] U.S. Cl. .................................... 307/112; 307/106; 307/353; 333/173; 328/151
[58] Field of Search ............... 307/112, 106, 297, 351, 307/352, 353, 362; 333/173; 328/150, 151, 162, 165

[56] References Cited

U.S. PATENT DOCUMENTS

| | | | |
|---|---|---|---|
| 3,671,782 | 6/1972 | Wittlinger et al. | 328/151 X |
| 3,818,246 | 6/1974 | Hellwarth et al. | 328/151 X |
| 4,315,227 | 2/1982 | Fleischer et al. | 333/173 |
| 4,352,070 | 9/1982 | Beauducel et al. | 328/151 |
| 4,404,479 | 9/1983 | Toyomaki | 307/353 |
| 4,446,438 | 5/1984 | Chang et al. | 333/173 X |
| 4,484,089 | 11/1984 | Viswanathan | 307/353 X |
| 4,520,283 | 5/1985 | Sasaki et al. | 333/173 X |
| 4,531,106 | 7/1985 | Ganesan | 328/151 X |
| 4,543,546 | 9/1985 | Hariharam | 333/173 |
| 4,546,324 | 10/1985 | Bingham et al. | 307/353 X |
| 4,558,292 | 12/1985 | Sasaki et al. | 333/173 |
| 4,591,736 | 5/1986 | Hirao et al. | 328/151 X |
| 4,600,904 | 7/1986 | Shumaker | 333/173 |

OTHER PUBLICATIONS

"A Precision FET-Less Sample-and-Hold With High Change-to-Droop Current Ratio", by IEEE, vol. SC-13, No. 6, Dec. 1978.

Primary Examiner—William M. Shoop, Jr.
Assistant Examiner—Paul Ip
Attorney, Agent, or Firm—Finnegan, Henderson, Farabow, Garrett & Dunner

[57] ABSTRACT

A sample-and-hold circuit has an impedance converter, a first switch, an amplifier, an input circuit for receiving an input signal and supplying an output signal corresponding to the input signal to the amplifier, through the impedance converter and the first switching means, output-holding capacitor coupled between the input and output terminals of the amplifier, and a feedback circuit coupled between the output terminal of the amplifier and the input terminal of the impedance converter. The input circuit and the feedback circuit are a first switched capacitor and a second switched capacitor, respectively.

13 Claims, 11 Drawing Figures

SAMPLE-AND-HOLD CIRCUIT

BACKGROUND OF THE INVENTION

The present invention relates to a sample-and-hold circuit for sampling and holding the output signals of an A/D converter used in communications systems, audio systems, video systems and the like.

Such a sample-and-hold circuit is disclosed in Rudy J. Van de Plassche, et al. *A Monolithic High-Speed Sample-and-Hold Amplifier for Digital Audio* in IEEE Journal of Solid-State Circuits, Vol. SC-18, No. 6, December 1983, p. 717 (FIG. 1). FIG. 1 shows the structure of this circuit. In this sample-and-hold circuit, an input signal $V_{IN}$ is supplied to the non-inverting input terminal (+) of operational amplifier 11 through resistor R1 and switch S1. The output of operational amplifier 11 is fed back to the inverting input terminal (−) of amplifier 11. It is also supplied to the inverting input terminal (−) of operational amplifier 12 through switch S3. The non-inverting input terminal (+) of operational amplifier 12 is grounded. The output of amplifier 12 is fed back to the inverting input terminal (−) of amplifier 12 through holding capacitor $C_H$. It is also supplied to node N1 of resistor R1 and switch S2 through resistor R2. Switch S2 is connected between node N1 and the ground. Switches S1, S2 and S3 are selectively turned on and off, thereby controlling the operation of sampling and holding input signal $V_{IN}$ and thus obtaining output signal $V_{OUT}$ at the output terminal of operational amplifier 12.

In the sample-and-hold circuit (SHC) of FIG. 1, an imaginary short-circuit occurs when switches S1 and S3 are simultaneously turned on. Potentials V1, V2 and V3 of node N1, node N2 (i.e., the output terminal of amplifier 11) and node N3 (i.e., the non-inverting input terminal of amplifier 12) thereby fall to the ground level. As a result, output signal $V_{OUT}$ becomes $-V_{IN}$. In other words, an inverse of input signal $V_{IN}$ is obtained at the output terminal of operational amplifier 12. When switches S1 and S3 are turned off and switch S2 is turned on, holding capacitor $C_H$ maintains the output of operational amplifier 12 at a level attained in the previous sampling cycle. Since switch S2 is on, potential V1 of node N1 is reliably held at the ground level.

It will now be explained how sample-and-hold circuit SHC shown in FIG. 1 functions to sample and hold the output of D/A converter 13 when circuit SHC is coupled to D/A converter 13 as is illustrated in FIG. 2.

When switch S4 connected between D/A converter 13 and sample-and-hold circuit SHC is turned on, thus coupling the output terminal of D/A converter 13 to the input terminal of sample-and-hold circuit SHC, input signal $V_{IN}$ of circuit SHC has the following value:

$$V_{IN} = V_{DAC} \cdot R / (Z + R)$$

where Z is the output impedance of D/A converter 13, $V_{DAC}$ is the output which D/A converter 13 produces when the output terminal of the converter is opened by turing off switch S4, and R is the input resistance of sample-and-hold circuit SHC.

Obviously, the higher the impedance (Z), the more the input signal ($V_{IN}$) attenuates. The condition of $Z < < R$ is therefore required. To satisfy this requirement, output impedance Z of D/A converter 13 must be lowered, or input resistance R of sample-and-hold circuit SHC must be raised.

SUMMARY OF THE INVENTION

The object of the present invention is to provide a sample-and-hold circuit which can reliably sample and hold the output of a D/A converter even if the D/A converter has a high output impedance.

To achieve this object, a sample-and-hold circuit according to the present invention comprises a first switched capacitor supplied with an input signal, an impedance converter for receiving the output of the first switched capacitor, an amplifier for receiving the output of the impedance converter through a switch, a capacitor coupled between the input and output terminals of the amplifier, and a second switched capacitor coupled between the output terminal of the amplifier and a node between the first switched capacitor and the impedance converter.

The input resistance of the sample-and-hold circuit of the invention can be equivalently regarded as being infinitely high since the input signal is supplied to the first switched capacitor. Therefore, the circuit can reliably sample and hold the output of an D/A converter without attenuating it, however high the output impedance of the D/A converter is.

DETAILED DESCRIPTION OF THE PREFERRED EMBODIMENTS

Figure 3:
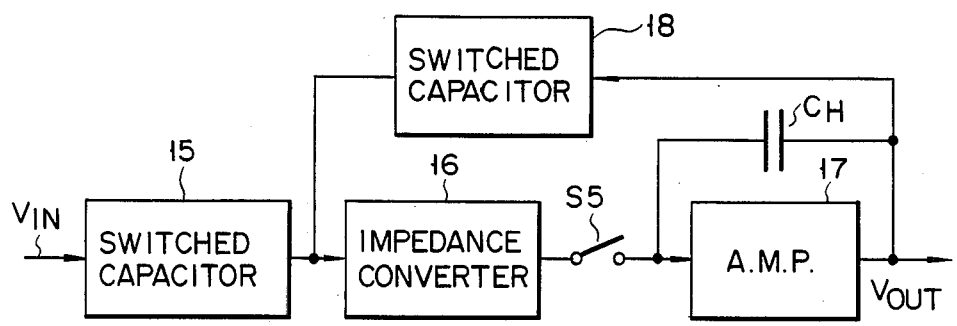
FIG. 3 is a block diagram of the sample-and-hold circuit according to a first embodiment of this invention.

FIG. 3 is a block diagram showing the sample-and-hold hold circuit according to an embodiment of the present invention. This circuit has switched capacitor 15 for receiving the output signal of a D/A converter. The output of switched capacitor 15 is supplied to the input terminal of an amplifier 17 through impedance converter 16 and switch S5. The output of amplifier 17 is fed back to the input terminal of amplifier 17 through holding capacitor $C_H$, and is also supplied to the input terminal of impedance converter 16 through switched capacitor 18.

The voltage gain ($V_{OUT}/V_{IN}$) of this sample-and-hold circuit (FIG. 3) is determined by the two switched capacitors 15 and 18. The sample-and-hold circuit is set to the sample mode when switch S5 is closed, and amplifier 17 generates output signal $V_{OUT}$ which is exactly an inverse to input signal $V_{IN}$ as long as the voltage gain is $-1$. On the other hand, the sample-and-hold circuit set to the hold mode when switch S5 is opened, and holding capacitor $C_H$ maintains the level of output signal $V_{OUT}$, which has been obtained in the preceding sampling cycle.

Figure 1:
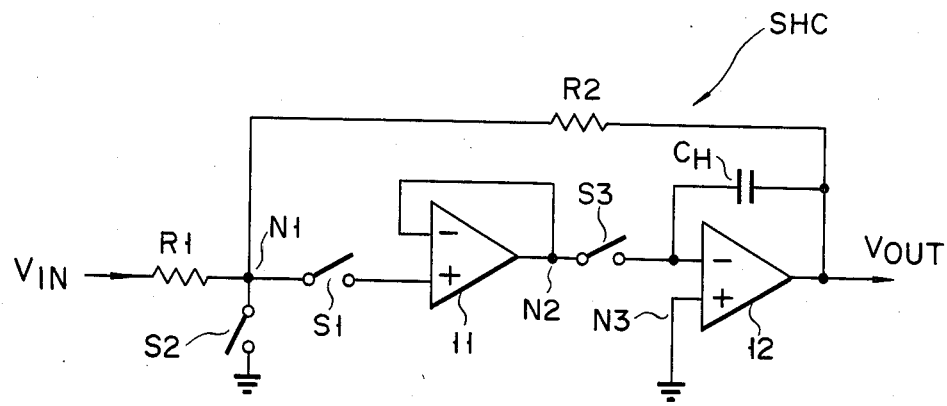
FIG. 1 is a circuit diagram of a conventional sample-and-hold circuit.
Figure 2:
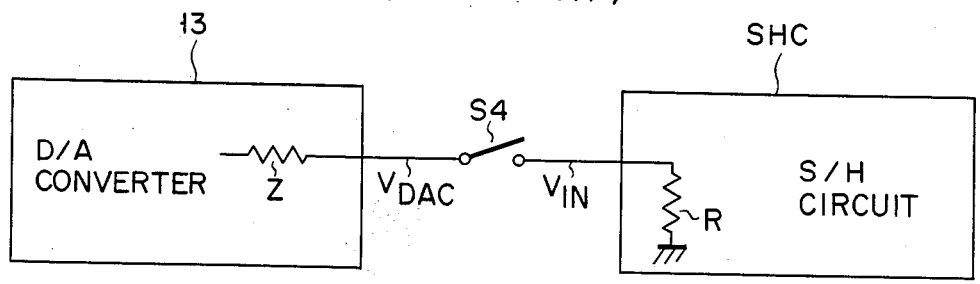
FIG. 2 shows the conventional electrical connection between a D/A converter and a sample-and-hold circuit.
Figure 4:
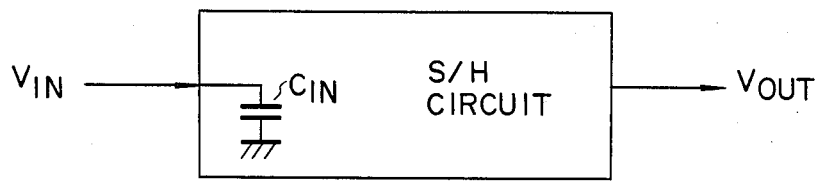
FIG. 4 shows the equivalent input impedance of the sample-and-hold circuit shown in FIG. 3.

As mentioned above, in the sample-and-hold circuit of FIG. 1, it is necessary to raise the input resistance (R). In contrast, the input resistance of the sample-and-hold circuit of FIG. 3 is indefinitely high since the input impedance is basically equal to capacitance $C_{IN}$ as is illustrated in FIG. 4. Therefore, it suffices to take only this input capacitance ($C_{IN}$) into consideration. Hence, the sample-and-hold circuit of FIG. 3 can prevent the attenuation of an input signal, without increasing the pattern area, even if the input signal is the output of a high output-impedance D/A converter such as a D/A converter of charge-redistribution type. The sample-and-hold circuit can, therefore, be applied to various uses.

Figure 5:
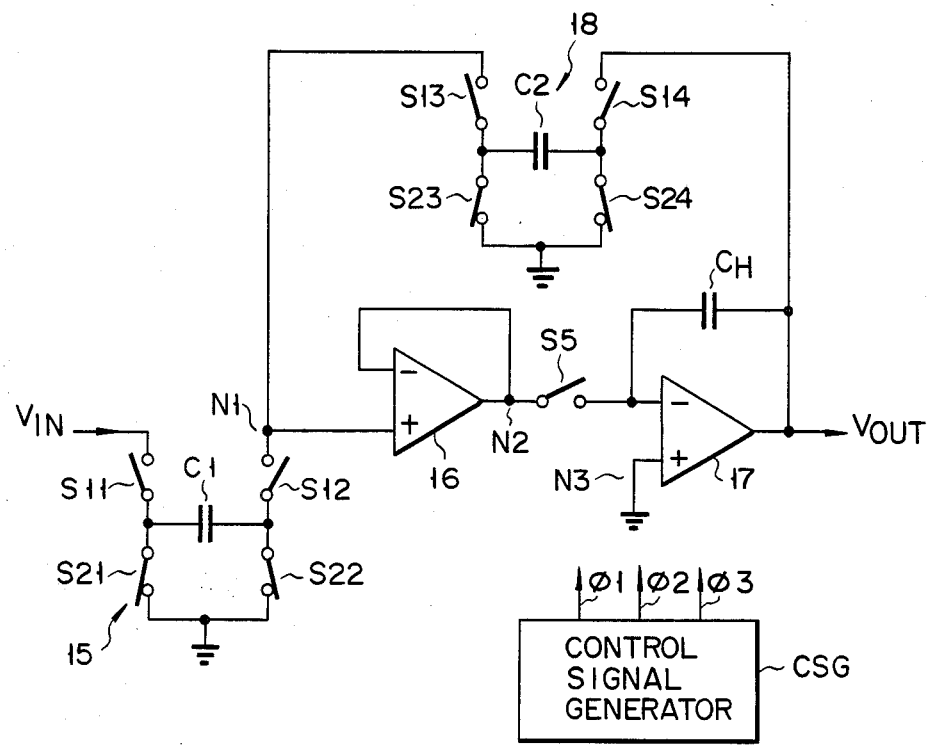
FIG. 5 is a circuit diagram showing the sample-and-hold circuit of FIG. 3 in detail.

FIG. 5 is a circuit diagram showing the circuit of FIG. 3 in greater detail. In this figure, the same numerals and symbols are used, designating the same elements as shown in FIG. 3. Input signal $V_{IN}$ is supplied to the non-inverting input terminal (+) of operational amplifier (impedance converter) 16 through switch S11, capacitor C1 and switch S12. Switch S21 is coupled between the ground and the node between switch S11 and capacitor C1. Switch S22 is coupled between the ground and the node between switch S12 and capacitor C1. The output terminal of operational amplifier 16 is connected to the inverting input terminal (−) thereof, and is coupled to switch S5 which in turn is connected to the inverting input terminal (−) of operational amplifier 17. The non-inverting input terminal (+) of amplifier 17 is grounded. The output terminal of amplifier 17 is connected to the inverting input terminal (−) through capacitor $C_H$. The output terminal of amplifier 17 is also connected to switch S14 which in turn is connected to one end of capacitor C2. The other end of capacitor C2 is coupled to switch S13 which in turn is connected to the non-inverting input terminal (+) of operational amplifier 16. Switch S24 is connected between the ground and the node between switch S14 and capacitor C2. Switch S23 is coupled between the ground and the node between switch S13 and capacitor C2.

In the circuit of FIG. 5, switches S11, S12, S21 and S22 and capacitor C1 form first switched capacitor 15, and switches S13, S14, S23 and S24 and capacitor C2 constitute second switched capacitor 18. Switches S11–S14, switches S21–S24 and switch S5 are controlled in response to clock signals $\phi1$–$\phi3$ shown in FIG. 6, which are generated by control signal generator CSG. More precisely, switches S11–S14 are controlled by clock signal $\phi1$, switches S21–S24 are controlled by clock signal $\phi2$, and switch S5 is controlled by clock signal $\phi3$. Each switch is closed when the clock signal supplied to it is at "1" level.

Figure 6:
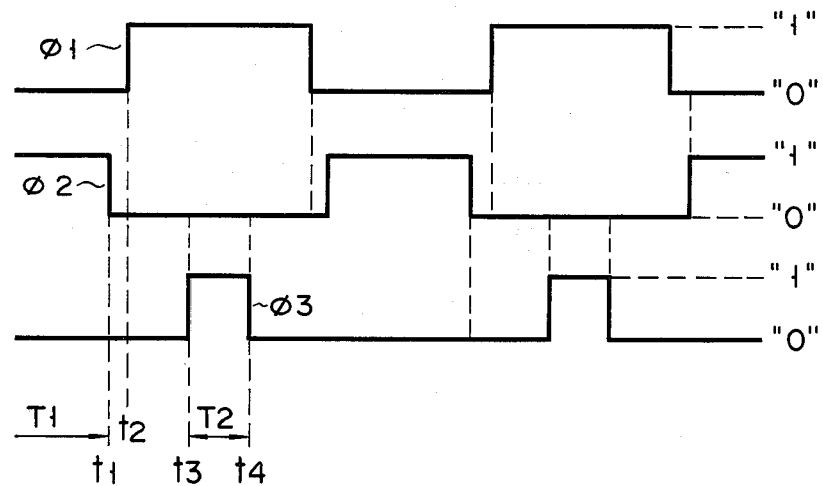
FIGS. 6 and 7 are timing charts explaining the operation of the circuit shown in FIG. 3.

As shown in the timing chart of FIG. 6, only clock signal $\phi2$ is at "1" level during period T1 which ends at time t1. Therefore, switches S21–S24 are kept on, and switches S11–S14 and switch S5 are kept off, during period T1. Hence, capacitors C1 and C2 are discharged during this period T1. When clock signal $\phi1$ rises to "1" level at time t2 after clock signal $\phi2$ has fallen to "0" level, switches S11–S14 are turned on. At time t2, switches S21–S14 and switch S5 are kept off. When clock signal $\phi3$ rises to "1" level at time t3 under this condition, switch S5 is turned on, thereby setting the sample-and-hold circuit into an imaginary short-circuited condition. In consequence, nodes N1, N2 and N3 are set at the ground potential. Electrical charge Q ($=C1 \cdot V_{IN}$) is accumulated in capacitor C1. The same charge is accumulated also in capacitor C2. Therefore:

$$Q = C1 \cdot V_{IN} = C2 \cdot (-V_{OUT})$$

Hence, voltage gain G is given:

$$G = V_{OUT}/V_{IN} = -C1/C2$$

If C1=C2, voltage gain G will be $-1$.

During period T2 when clock signal $\phi3$ remains at "1" level, input signal $V_{IN}$ is sampled, and amplifier 17 generates output signal $V_{OUT}$ corresponding to input signal $V_{IN}$.

When clock signal $\phi3$ falls to "0" level at time t4, switch S5 is turned off. Output signal $V_{OUT}$ generated during period T2, i.e., the sampling cycle, is thereafter held by capacitor $C_H$ until clock signal $\phi3$ rises to "1" level again.

Figure 7:
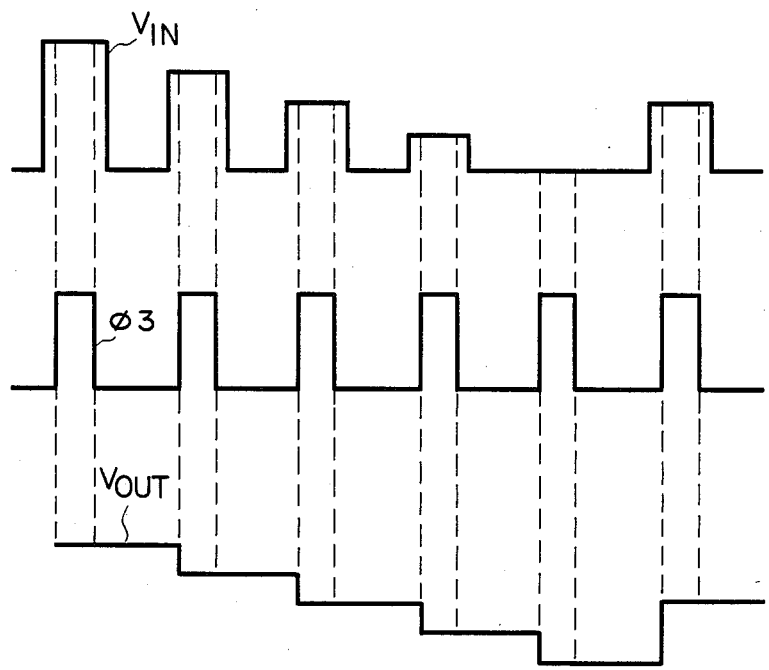

FIG. 7 shows the timing relationship of input signal $V_{IN}$, clock signal $\phi3$, and output signal $V_{OUT}$ in the sample-and-hold circuit of FIG. 5. As this figure clearly shows, amplifier 17 produces an output signal at negative high level when input signal $V_{IN}$ is at positive high level, and clock signal $\phi3$ is simultaneously at "1" level. Output signal $V_{OUT}$ is held at the same level until clock signal $\phi3$ rises to "1" level again. When input signal $V_{IN}$ falls or rises in the next sampling cycle, the output signal generated by amplifier 17 proportionately falls or rises. In the sample-and-hold circuit, the input signal is sampled while clock signal $\phi3$ is at "1" level, and the voltage stored in capacitor $C_H$ while clock signal $\phi3$ is at "1" level is held until clock signal $\phi3$ rises to "1" level again.

Figure 8:
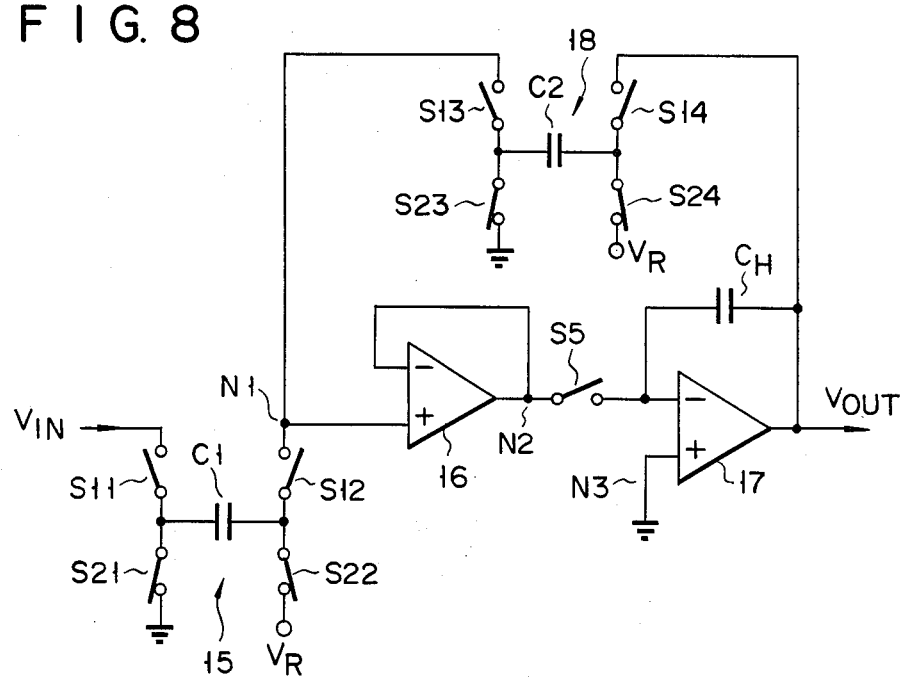
FIGS. 8 and 9 are circuit diagrams showing the main sections of two other sample-and-hold circuits according to the present invention.

FIG. 8 shows another embodiment of the invention. The sample-and-hold circuit shown in this figure is similar to the circuit of FIG. 5 except that switches S21 and S23 are grounded at one end, and switches S22 and S24 are coupled at one end to a source of voltage VR. In this regard, it should be noted that switches S21–S24 are grounded at one end in the circuit of FIG. 5. In FIG. 8, the same numerals and symbols are used to designate the same elements as shown in FIG. 5. In the sample-and-hold circuit of FIG. 8, capacitors C1 and C2 are charged to voltage VR when switches S22 and S24 are on, and a bias of VR is added to output signal $V_{OUT}$.

Figure 9:
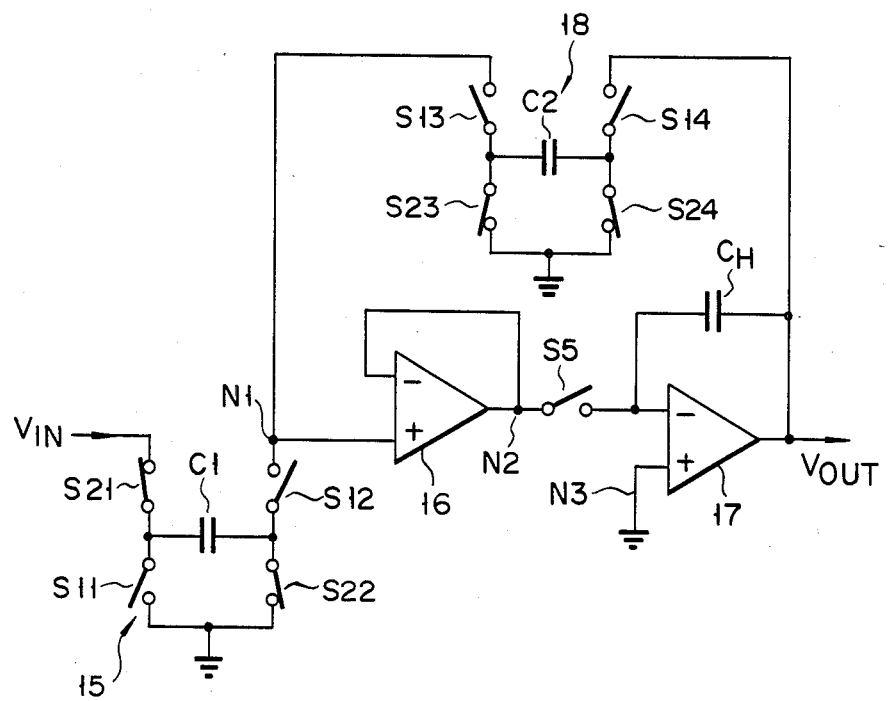

FIG. 9 illustrates still another embodiment of this invention. The sample-and-hold circuit shown in this figure is similar to the circuit of FIG. 5 except that switched capacitor 15A, which functions as a negative resistor, is used in place of switched capacitor 15 (FIG. 5). To be specific, switches S11 and S21 take each other's position. Hence, when clock signal $\phi2$ is at "1" level, switches S21 and S22 are on, thereby connecting capacitor C1 between the input terminal ($V_{IN}$) and the ground, and thus charging capacitor C1. When clock signal $\phi1$ is at "1" level (and clock signal $\phi2$ is at "0" level), switches S11 and S12 are on, thereby supplying the electrical charge from capacitor C1 to node N1. In this manner, switched capacitor 15A operates as a negative resistor. As a result, output signal $V_{OUT}$ is inphase with input signal $V_{IN}$.

Figure 10:
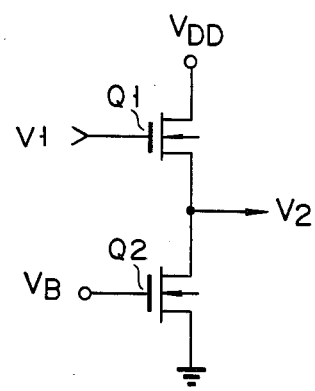
FIG. 10 shows an impedance converter which can be used in place of the impedance converter employed in the sample-and-hold circuit shown in FIG. 5.
Figure 11:
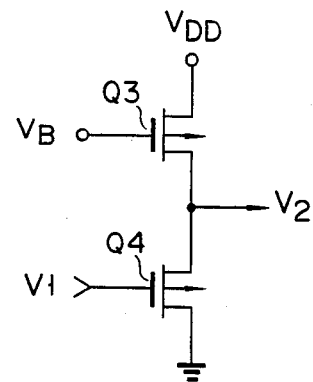
FIG. 11 shows another impedance converter which can be used in place of the impedance converter used in the sample-and-hold circuits shown in FIGS. 8 and 9.

The present invention is not limited to the embodiments described above. For example, either the source follower shown in FIG. 10 or the source follower shown in FIG. 11 can be used as an impedance converter in place of the voltage follower 16 shown in FIG. 5. The source follower of FIG. 10 comprises N-channel MOS transistors Q1 and Q2 connected in series between power supply $V_{DD}$ and the ground. Output signal V1 of switched capacitor 15 is supplied to the gate of MOS transistor Q1, thereby making this MOS transistor conductive or non-conductive. Predetermined bias VB is applied to the gate of MOS transistor Q2. Output voltage V2 is applied from the node between MOS transistors Q1 and Q2 to amplifier 17 through switch S5. On the other hand, the source follower of FIG. 11 comprises P-channel MOS transistors Q3 and Q4 coupled in series between power source $V_{DD}$ and the ground. Predetermined bias VB is applied to the gate of MOS transistor Q3. Output voltage V1 of switched capacitor 15 is applied to the gate of MOS transistor Q4, thereby rendering MOS transistor Q4 conductive or non-conductive. Output voltage V2 is applied from the node between MOS transistors Q3 and Q4 to amplifier 17 through switch S5.

What is claimed is:

1. A sample-and-hold circuit comprising:
   a first switched capacitor receiving an input signal and producing an output signal at an output terminal;
   impedance-converting means, having an input terminal receiving said output signal from the first switched capacitor, for presenting said output signal at an output terminal having an output impedance which is lower than an output impedance at the output terminal of said first switched capacitor, said impedance converting means including a unity gain amplifier;
   amplifying means having input and output terminals;
   first switching means coupled between the input terminal of said amplifying means and the output terminal of said impedance-converting means to selectively connect and disconnect said amplifying means and said impedance converting means;
   output-holding capacitive means coupled between the input and output terminals of the amplifying means; and
   a second switched capacitor coupled between the output terminal of the amplifying means and the input terminal of the impedance-converting means.

2. A sample-and-hold circuit according to claim 1, further comprising
   second through fifth switching means, and
   first and second voltage terminals,
   wherein said first switched capacitor includes a first capacitor connected at one end to said first voltage terminal by said third switching means to receive said input signal through said second switching means, and connected at another end to both the input terminal of said impedance-converting means by said fourth switching means and to said second voltage terminal by said fifth switching means.

3. A sample-and-hold circuit according to claim 2, further including sixth through ninth switching means, wherein said second switched capacitor includes a second capacitor connected at one end to both the output terminal of said amplifying means by said sixth switching means and to said second voltage terminal by said seventh switching means, and connected at another end both to the input terminal of said impedance-converting means by said eighth switching means and to said first voltage terminal by said ninth switching means.

4. A sample-and-hold circuit according to claim 3, wherein said first and second voltage terminals are ground terminals.

5. A sample-and-hold circuit according to claim 4, wherein said second, fourth, sixth and eighth switching means are simultaneously rendered on and off, and said third, fifth, seventh and ninth switching means are simultaneously rendered on and off.

6. A sample-and-hold circuit according to claim 4, wherein said third, fourth, sixth and eighth switching means are simultaneously rendered on and off, and said second, fifth, seventh and ninth switching means are simultaneously rendered on and off.

7. A sample-and-hold circuit according to claim 3, wherein said first voltage terminal is a ground terminal, and said second voltage terminal is a bias voltage terminal.

8. A sample-and-hold circuit according to claim 3, wherein said impedance-converting means is a voltage follower circuit.

9. A sample-and-hold circuit according to claim 3, wherein said impedance-converting means is a source follower circuit having a first MOS transistor whose gate receives an output signal from said first switched capacitor, and a second MOS transistor which is coupled in series to the first MOS transistor and whose gate receives a predetermined voltage.

10. A sample-and-hold circuit according to claim 3, wherein said amplifying means is an operational amplifier.

11. A sample-and-hold circuit according to claim 1, wherein said impedance-converting means is a voltage follower circuit.

12. A sample-and-hold circuit according to claim 1, wherein said impedance-converting means is a source follower circuit having a first MOS transistor whose gate receives an output signal from said first switched capacitor, and a second MOS transistor which is coupled in series to the first MOS transistor and whose gate receives a predetermined voltage.

13. A sample-and-hold circuit according to claim 1, wherein said amplifying means is an operational amplifier.

* * * * *